(12) United States Patent
Chatterjee

(10) Patent No.: US 7,808,288 B2
(45) Date of Patent: Oct. 5, 2010

(54) SYSTEM AND METHOD FOR AN AUTOMATIC COARSE TUNING OF A VOLTAGE CONTROLLED OSCILLATOR IN A PHASE-LOCKED LOOP (PLL)

(75) Inventor: Kallol Chatterjee, West Bengal (IN)

(73) Assignee: STMicroelectronics, Pvt. Ltd., Greater Noida (IN)

( * ) Notice: Subject to any disclaimer, the term of this patent is extended or adjusted under 35 U.S.C. 154(b) by 346 days.

(21) Appl. No.: 12/006,080

(22) Filed: Dec. 28, 2007

(65) Prior Publication Data

US 2008/0238505 A1    Oct. 2, 2008

(30) Foreign Application Priority Data

Dec. 28, 2006    (IN) ............... 2820/DEL/2006

(51) Int. Cl.
    *H03L 7/06* (2006.01)
(52) U.S. Cl. .................. 327/156; 327/147
(58) Field of Classification Search ............ 327/147, 327/156
    See application file for complete search history.

(56) References Cited

U.S. PATENT DOCUMENTS

| | | | |
|---|---|---|---|
| 5,254,955 A * | 10/1993 | Saeki et al. ............ 327/156 |
| 6,384,648 B1 * | 5/2002 | O'Toole et al. .......... 327/156 |
| 6,597,249 B2 * | 7/2003 | Chien et al. ............ 331/177 R |
| 7,164,322 B1 * | 1/2007 | Knotts et al. ........... 331/1 A |
| 7,348,818 B2 * | 3/2008 | Hulfachor et al. ........ 327/156 |
| 7,486,147 B2 * | 2/2009 | Khorram ................ 331/16 |
| 7,719,329 B1 * | 5/2010 | Smith et al. ............ 327/157 |
| 2005/0226357 A1 | 10/2005 | Yoshimura | |
| 2010/0001771 A1 * | 1/2010 | Liu et al. .............. 327/157 |

\* cited by examiner

*Primary Examiner*—Lincoln Donovan
*Assistant Examiner*—Adam D Houston
(74) *Attorney, Agent, or Firm*—Lisa K. Jorgenson; Kevin D. Jablonski; Graybeal Jackson LLP

(57) ABSTRACT

Circuits and methods for an automatic coarse tuning in a phase locked loop (PLL) include observing a variation in a control voltage to disable a fine loop and to enable a coarse loop as the control voltage departs from a specified range. The circuit includes the fine loop, the coarse loop, and a control circuit. The fine loop includes a phase frequency detector (PFD), a charge pump, a loop filter, a VCO and a divider. The coarse loop includes a frequency detector, an up counter, a down counter, and an LC VCO. The control circuit includes a bandgap module, a comparator and other circuits such as a lock detect circuit. The control circuit is used to switch between the coarse loop and the fine loop.

8 Claims, 7 Drawing Sheets

SYSTEM AND METHOD FOR AN AUTOMATIC COARSE TUNING OF A VOLTAGE CONTROLLED OSCILLATOR IN A PHASE-LOCKED LOOP (PLL)

PRIORITY CLAIM

This application claims priority from Indian patent application No. 2820/Del/2006, filed Dec. 28, 2006, which is incorporated herein by reference.

TECHNICAL FIELD

Embodiments of the present invention relate to integrated circuits and more specifically to a circuit and a method for an automatic coarse tuning of a voltage controlled oscillator (VCO) in a phase locked loop circuit.

BACKGROUND

In integrated circuits, voltage controlled oscillators (VCOs) are an integral part of phase-locked loops (PLLs) contained in such integrated circuits and are important in communication circuits. For example, a voltage controlled oscillator (VCO) is often used to generate local oscillator signals used by transmitter and receiver subsystems for frequency up conversion and down conversion, respectively. An inductor-capacitor (LC) tank PLL is used in clock data recovery circuits in order to achieve very good jitter performance.

An LC tank VCO is specifically designed to operate at a specific frequency or a specified range of frequencies. The frequency of oscillation for the LC tank VCO may deviate from a nominal design value due to various factors such as circuit component tolerances, i.e., on chip spiral inductor variation, varactor variation, integrated circuit process variations, and circuit component aging. The oscillation frequency may also change during normal operation due to various factors such as temperature and power supply variation. So in any LC tank VCO external coarse tuning is required in order to adjust a center frequency of the VCO to compensate for process, voltage and temperature (PVT) variations. This coarse tuning can be done manually, that is externally switching on/off coarse tuning bits to readjust the center frequency or can be done automatically on chip.

FIG. 1 illustrates a prior art automatic frequency correction phase-locked loop (PLL) circuit. The circuit includes an analog control circuit and a digital control circuit. The digital control circuit includes a high-side comparator and a low-side comparator which receive an analog control voltage, a state monitor circuit, and a counter and decoder circuit. At least one of the high-side comparator and the low-side comparator includes a threshold switching circuit which selectively gives a first threshold and a second threshold having different values. When the analog control voltage remains between the high-side threshold and the low-side threshold in a state in which the threshold switching circuit gives the first threshold, the threshold switching circuit switches the first threshold to the second threshold and expands the interval between the high-side threshold and the low-side threshold.

In this type of conventional architecture, when the digital tuning has been completed and the analog tuning takes over the control voltage can sit at a very low value or at a very high value to achieve the required center frequency. This can cause a lot of VCO gain variation depending on the digital code that has been set during the coarse lock. Secondly, after the digital coarse loop has done its operation and the analog fine loop takes over, if there are some variations in the frequency due to temperature and voltage only the analog fine loop has to correct them, the digital coarse loop does not correct them. The digital coarse loop only corrects for the process variation in the VCO component values.

There is a need for a novel architecture that automatically switches on the coarse tuning loop, whenever needed, to compensate for the PVT variations by constantly monitoring the control voltage.

SUMMARY

An embodiment of the present invention provides an architecture for an automatic coarse tuning of a phase locked loop circuit, and embodiments of the present invention provide a voltage controlled oscillator module for generating a frequency within a specified range.

An embodiment of the present invention provides a circuit for an automatic coarse tuning in a phase locked loop (PLL) by observing a variation in a control voltage to disable a fine loop and to enable a coarse loop as the control voltage departs from a specified range. The circuit includes a bandgap module operatively coupled to the circuit for generating one or more signals. A loop filter is connected between the bandgap module and a first intermediate node for providing the control voltage. A coarse loop module is operatively coupled to the bandgap module and a second intermediate node for providing a coarse loop signal to the circuit for switching on a coarse loop tuning. The coarse loop module receives the one or more signals from the bandgap module and receives the control voltage from the first intermediate node. A phase frequency detector is connected to a first node and a second node for comparing phases of a first input signal and a second input signal. The phase frequency detector receives the coarse loop signal. A charge pump is operatively coupled to the phase frequency detector for providing the control voltage at the first intermediate node. The charge pump receives the coarse loop signal. A frequency detector is connected to the first node, a third node and a fourth node for generating one of an up signal and a down signal, and receives the coarse loop signal. An up counter is connected to the frequency detector for incrementing a count number, the up counter receiving the coarse loop signal. A down counter connected to the frequency detector for decrementing a count number, said down counter receiving the coarse loop signal. A voltage controlled oscillator (VCO) module is operatively coupled to the up counter, the down counter, the charge pump, the loop filter, and the coarse loop module for generating an output signal at a third intermediate node for ensuring that variations in the output signal and a gain of said VCO are within the specified range. A divider is connected between the third node, the fourth node and the third intermediate node for dividing the output signal, the divider being coupled to the second node for providing the second input signal.

Another embodiment of the present invention provides a voltage controlled oscillator module for generating a frequency within a specified range. The module includes a first transistor connected between a first VCO node and a ground voltage. A latch circuit is operatively coupled between the first VCO node, a second VCO node and a third VCO node. A first variable capacitor is connected between the second VCO node and a fourth VCO node. A first fixed capacitor is connected between the second VCO node and the ground voltage. A second variable capacitor is connected between the third VCO node and the fourth VCO node. A second fixed capacitor is connected between the third VCO node and the ground voltage. A first switched capacitance module is connected between the second VCO node and a complementary ground voltage, the first switched capacitance module comprising at least four input terminals for receiving up binary bits. A second switched capacitance module is connected between the second VCO node and the complementary ground voltage, the second switched capacitance module comprising at least four input terminals for receiving down binary bits. An inductor is connected between the second VCO node and the third VCO node for providing a bias voltage through a center tap. A third switched capacitance module is connected between the third node and the complementary ground voltage, the third switched capacitance module comprising at least four output terminals for providing up binary bits. A fourth switched capacitance module is connected between the third node and the complementary ground voltage, the fourth switched capacitance module comprising at least four output terminals for providing down binary bits.

Another embodiment of the present invention provides a method for an automatic coarse tuning of a phase locked loop (PLL). The method includes sensing a variation in a control voltage to disable a fine loop and to enable a coarse loop as the control voltage departs from a specified range; charging a voltage controlled oscillator to an operating control voltage; generating a VCO output corresponding to the applied operating control voltage; dividing the VCO output; applying divider outputs to a frequency detector and a phase frequency detector; generating one of an up signal and a down signal; applying a frequency detector output to one of an up counter and down counter; counting one of a increment value or a decrement value; and generating a lock signal to stop the coarse tuning.

BRIEF DESCRIPTION OF THE DRAWINGS

The aforementioned aspects and other features of the present invention will be explained in the following description of embodiments thereof, taken in conjunction with the accompanying drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
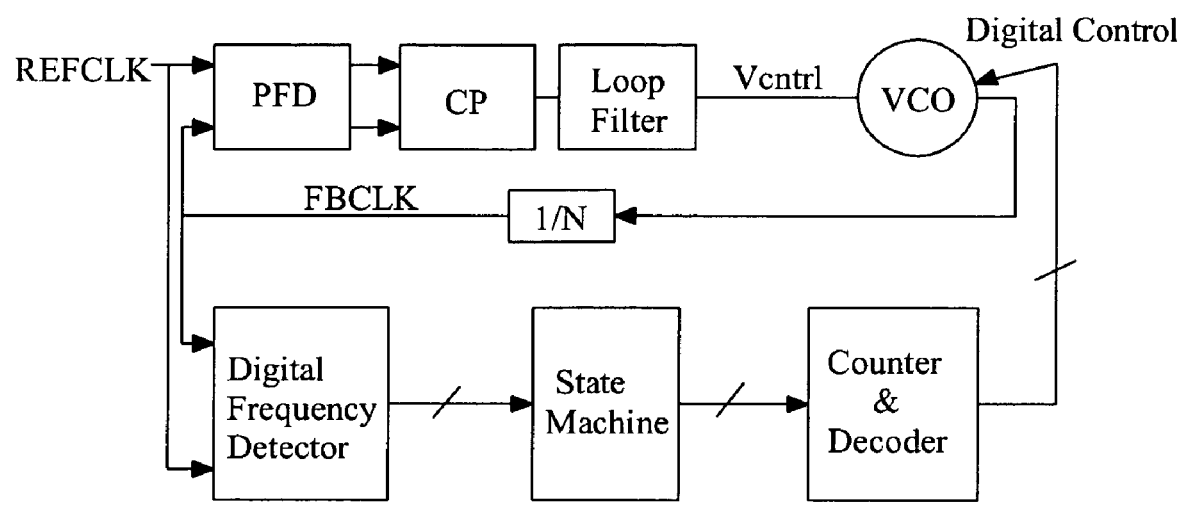
FIG. 1 is a block diagram of conventional automatic coarse tuning LC VCO in a PLL.
Figure 2:
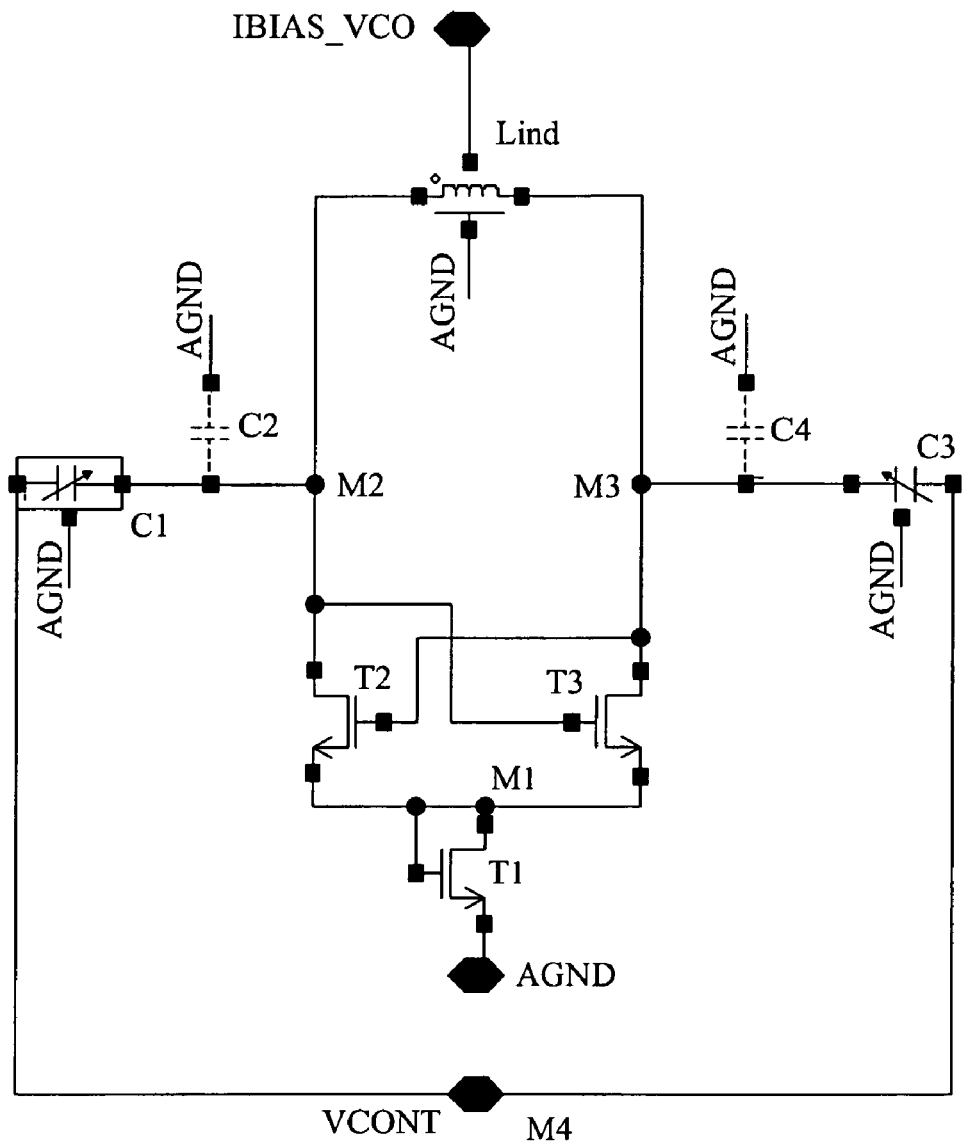
FIG. 2 is a schematic circuit diagram of an LC tank VCO with a center tapped inductor.

FIG. 2 is a schematic circuit diagram of an LC tank VCO with a center tapped inductor. The VCO includes a first transistor T1, a second transistor T2, a third transistor T3, a first variable capacitor C1, a first fixed capacitor C2, a second variable capacitor C3, a second fixed capacitor C4, and an inductor (Lind). The first transistor T1 is connected between a first VCO node M1 and a ground voltage AGND. The second transistor T2 and the third transistor T3 are operatively coupled to each other forming a latch circuit. The latch circuit is operatively coupled between the first VCO node M1, a second VCO node M2 and a third VCO node M3. The inductor is connected between the second VCO node M2 and the third VCO node M3 for providing a bias voltage through a center tap. The first variable capacitor C1 is connected between the second VCO node M2 and a fourth VCO node M4. The first fixed capacitor C2 is connected between the second VCO node M2 and the ground voltage AGND. The second variable capacitor C3 is connected between the third VCO node M3 and the fourth VCO node M4. The second fixed capacitor C4 is connected between the third VCO node M3 and the ground voltage AGND.

Figure 3:
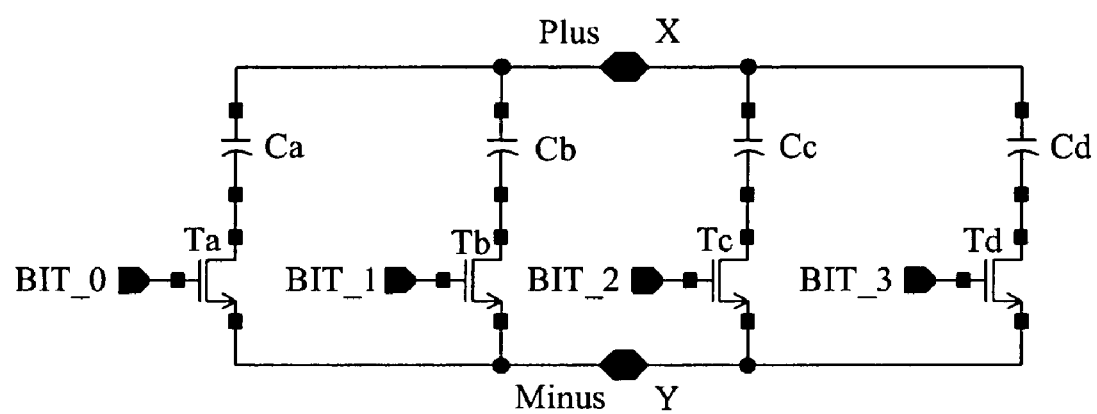
FIG. 3 is a schematic circuit diagram of a switched capacitance module.

FIG. 3 is a schematic circuit diagram of a switched capacitance module. The switched capacitance module is a combination of a capacitor and metal oxide semiconductor (MOS) switches that are turned on and off periodically. A capacitor Ca is serially connected to a transistor Ta at its drain terminal. Similarly, capacitors Cb, Cc, Cd are serially connected to transistors Tb, Tc, Td, respectively, at their drain terminals. The other end of the capacitors, i.e., the capacitor Ca, the capacitor Cb, the capacitor Cc and the capacitor Cd, are connected to a node X. The other end of the transistors, i.e. the source terminal of the transistor Ta, the transistor Tb, the transistor Tc and the transistor Td, are connected to a node Y. The gate terminals of transistors are configured to receive binary bits, i.e. BIT_0, BIT_1, BIT_2, BIT_3 at Ta, Tb, Tc, and Td, respectively.

Figure 4:
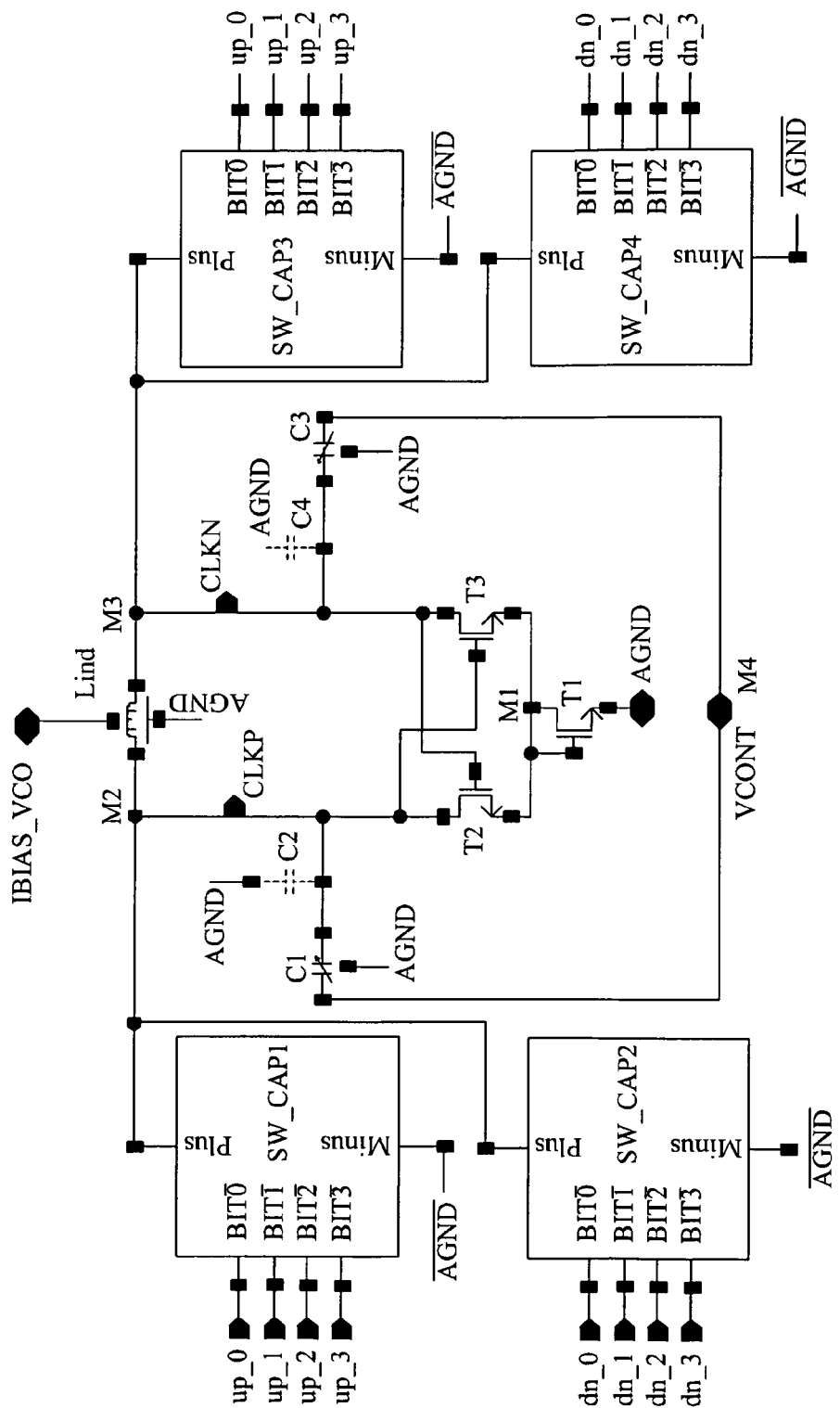
FIG. 4 is a schematic circuit diagram of an LC tank VCO with a switched capacitance module according to an embodiment of the present invention.

FIG. 4 illustrates a schematic diagram of an LC tank VCO with switched capacitance circuit according to one embodiment of the present invention. The VCO is a combination of an LC tank voltage controlled oscillator (VCO) with center tapped inductor as illustrated in FIG. 2 and a switched capacitance module as illustrated in FIG. 3 for realizing automatic coarse tuning. In addition to the VCO as illustrated in FIG. 2, the circuit of FIG. 4 includes a first switched capacitance module (SW_CAP1), a second switched capacitance module (SW_CAP2), a third switched capacitance module (SW_CAP3) and a fourth switched capacitance module (SW_CAP4).

The first switched capacitance module (SW_CAP1) is connected between the second VCO node M2 and a complementary ground voltage $\overline{AGND}$ or AGND bar. The first switched capacitance module (SW_CAP1) includes multiple input terminals for receiving up binary bits. The second switched capacitance module (SW_CAP2) is connected between the second VCO node M2 and the complementary ground voltage $\overline{AGND}$ or AGND bar. The second switched capacitance module (SW_CAP2) includes multiple input terminals for receiving down binary bits. The third switched capacitance module (SW_CAP3) is connected between the third VCO node and the complementary ground voltage $\overline{AGND}$ or AGND bar. The third switched capacitance module (SW_CAP3) includes multiple output terminals for providing up binary bits. The fourth switched capacitance module (SW_CAP4) is connected between the third VCO node and the complementary ground voltage $\overline{AGND}$ or AGND bar. The fourth switched capacitance module (SW_CAP4) includes multiple output terminals for providing down binary bits.

Figure 5:
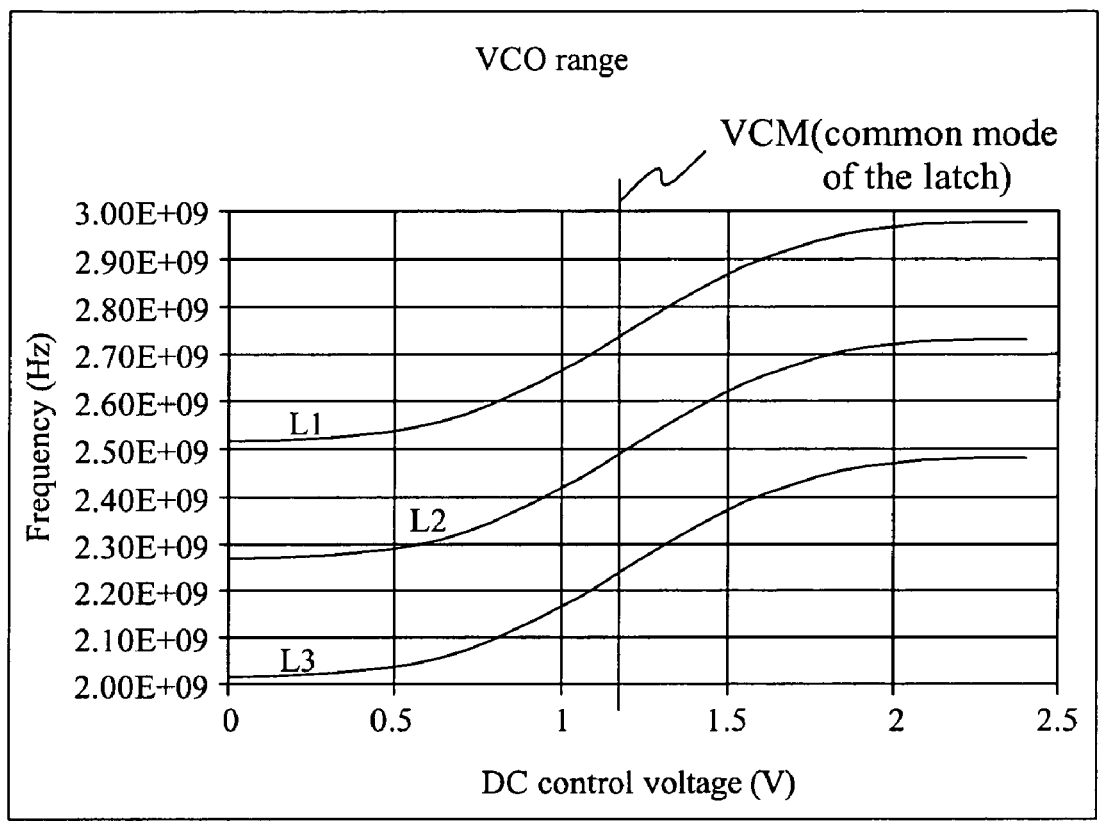
FIG. 5 illustrates a graph depicting gain characteristics of an LC tank VCO with a switched capacitance module.

FIG. 5 illustrates a graph depicting gain characteristics of the LC tank VCO with switched capacitance modules of FIG.

4 according to one embodiment of the present invention. The line L1 corresponds to VCO characteristics with a value of inductor and varactor when all the switched capacitance is OFF. The line L2 corresponds to VCO characteristics with a value of inductor and varactor when half of the switched capacitance (DN capacitance bank) is ON and another half of the switched capacitance (UP capacitance bank) is OFF. The line L3 corresponds to VCO characteristics with typical value of inductor and varactor when all the switched capacitance is ON.

The capacitance can be varied from a minimum value to a maximum value in fixed steps depending on the number of bits used to vary the capacitance. The minimum capacitance is Cpar+2*Cpar+4*Cpar+8*Cpar (Cpar is the parasitic capacitance) and the maximum capacitance is C+2C+4C+8C. The center frequency of the VCO can vary due to the PVT variations by as large as +/−10%, i.e. if the VCO was designed to have a center frequency of 2.5 GHz it can vary from 2.25 GHZ to 2.75 GHZ. Assuming that the amount of coarse tuning is equal to the amount of fine tuning the varactor value is split into half. Half of the value is used as fine varactor whose capacitance can tune the VCO center frequency by +/−10%. The other half is used to make switched capacitance.

There are two banks of switched capacitance each bank consisting of a four binary weighted capacitance. One is called the UP tune bank and the other is called the DOWN tune bank. With the typical inductance value, typical fine varactor value and with the typical control voltage the tank oscillates with a center frequency of 2.5 GHz with one of either the UP capacitor bank or the DOWN capacitor bank switched on and the other capacitor bank switched off. When the UP bank is switched off completely and the DOWN bank is also switched off completely the center frequency can be increased by 10%. When the UP bank is switched on completely and the DOWN bank is also switched on completely the center frequency can be reduced by 10%. Thus even with the capacitance bank we can obtain +/−10% of tuning range for a fixed control voltage. This is illustrated in the varactor tuning curves in FIG. 5. The minimum frequency step that can be achieved with a single bit change in the UP Capacitor Bank is +20 MHz and with the DOWN capacitor bank is −20 MHz.

Figure 6:
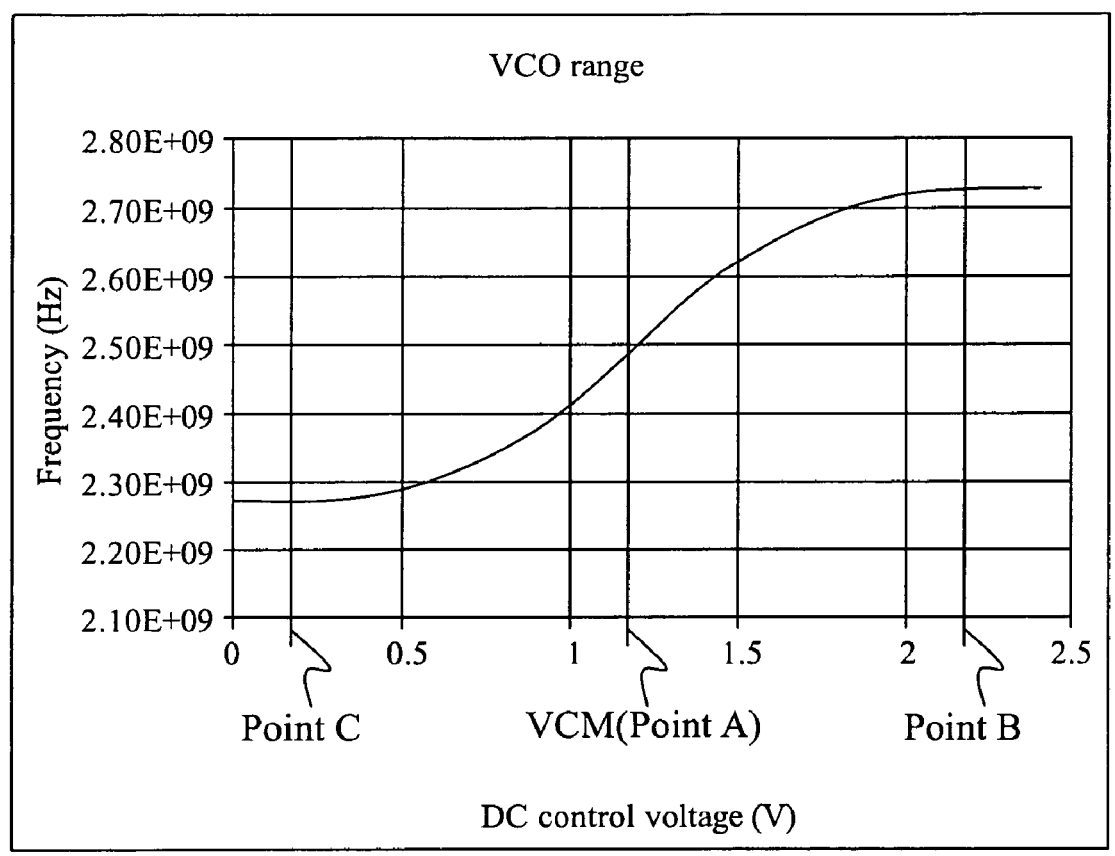
FIG. 6 is a graph depicting gain characteristics of an LC tank VCO.

FIG. 6 is a graph depicting gain characteristics of the LC tank VCO of FIG. 4 according to one embodiment of the present invention.

Figure 7:
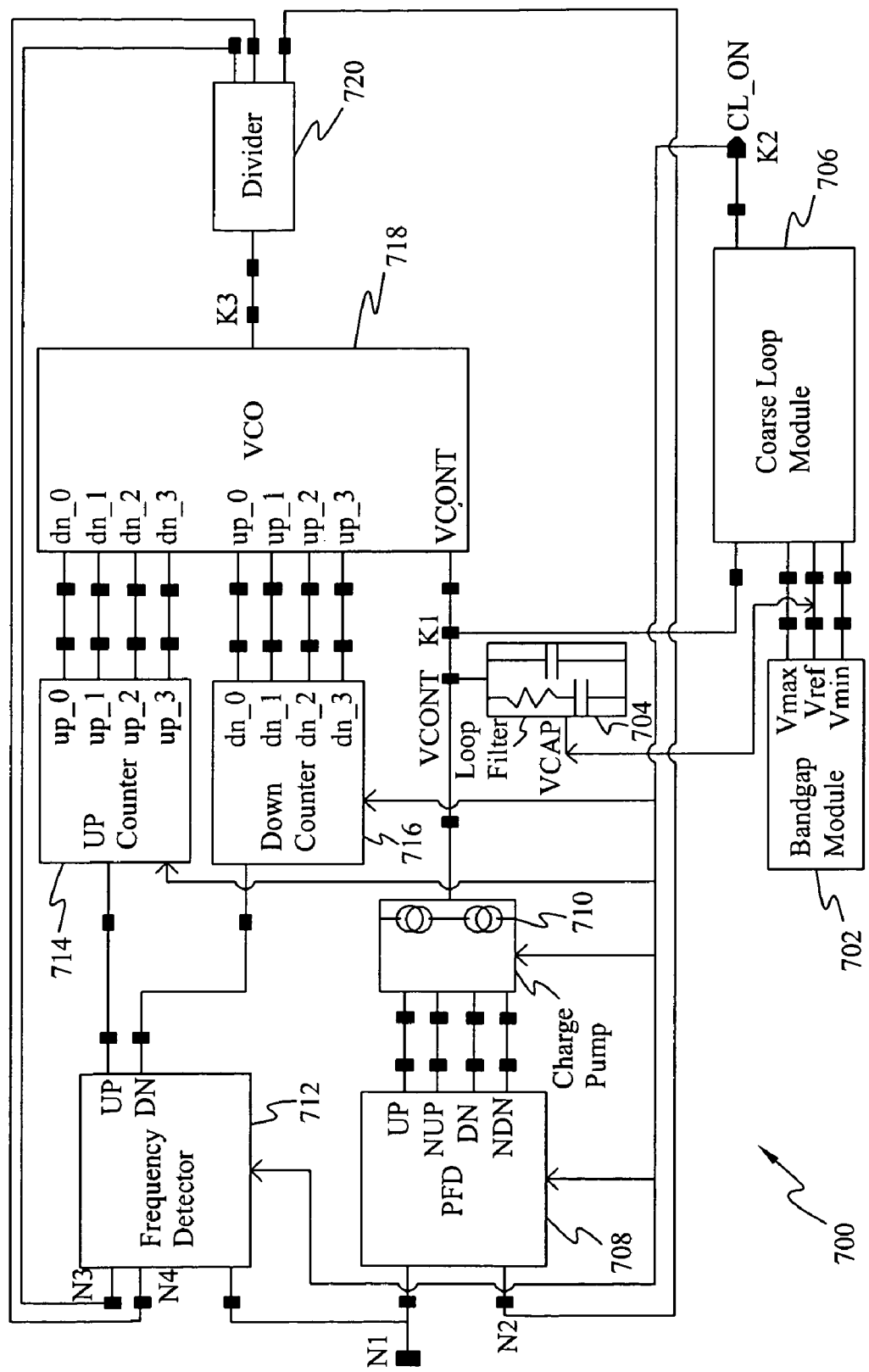
FIG. 7 illustrates a schematic diagram of a circuit for an automatic coarse tuning in a phase locked loop (PLL) according to an embodiment of the present invention.

FIG. 7 is a schematic diagram of a circuit 700 for an automatic coarse tuning in a phase locked loop (PLL), by observing a variation in a control voltage to disable a fine loop and to enable a coarse loop as the control voltage departs from a specified range, according to an embodiment of the present invention. The circuit includes a bandgap module 702, a loop filter 704, a coarse loop module 706, a phase frequency detector 708, a charge pump 710, a frequency detector 712, an up counter 714, a down counter 716, a voltage controlled oscillator (VCO) module 718 and a divider 720 for ensuring that variations in the output signal and a gain of the VCO being within the specified range.

The bandgap module 702 is operatively coupled to the circuit 700 for generating one or more signals. The one or more signals are a Vmax, a Vref and a Vmin. The loop filter 704 is connected between the bandgap module 702 and a first intermediate node K1 for providing the control voltage VCONT. The coarse loop module 706 is operatively coupled to the bandgap module 702 and a second intermediate node K2 for providing a coarse loop signal CL_ON to the circuit 700 for switching on a coarse loop tuning. The coarse loop module 706 receives the one or more signals from the bandgap module 702 and receives the control voltage VCONT from the first intermediate node K1. The phase frequency detector 708 is connected to a first node N1 and a second node N2 for comparing phases of a first input signal and a second input signal. The phase frequency detector 708 receives the coarse loop signal CL_ON. The charge pump 710 is operatively coupled to the phase frequency detector 708 for providing the control voltage VCONT at the first intermediate node K1. The charge pump 710 receives the coarse loop signal CL_ON. The frequency detector 712 is connected to the first node N1, a third node N3 and a fourth node N4 for generating one of an up signal and a down signal. The frequency detector 712 receives the coarse loop signal CL_ON. The up counter 714 is connected to the frequency detector 712 for incrementing a count number. The up counter 714 receives the coarse loop signal CL_ON. The down counter 716 is connected to the frequency detector 712 for decrementing a count number. The down counter 716 also receives the coarse loop signal CL_ON. The voltage controlled oscillator (VCO) module 718 is operatively coupled to the loop filter 704, the coarse loop module 706, the charge pump 710, the up counter 714, and the down counter 716, for generating an output signal at a third intermediate node K3. The divider 720 is connected between the third node N3, the fourth node N4 and the third intermediate node K3 for dividing the output signal. The divider 720 is coupled to the second node N2 for providing the second input signal. The first input signal provided at the first node N1 includes an input reference frequency signal. The second input signal provided at the second node N2 includes a feedback reference frequency signal.

The main components of the circuit 700 are divided broadly into three parts: the fine loop, the coarse loop, and a control circuit. The fine loop includes the phase frequency detector PFD 708, the charge pump 710, the loop filter 704, the VCO 718 and the divider 720 (divide by N). The coarse loop includes the frequency detector 712, the up counter 714 (counts from 0000 to 1111), the down counter 716 (counts from 1111 to 0000), and the LC VCO 718. The control circuit includes the bandgap module 702 (to generate 3 reference voltages to compare with the control voltage), a comparator (to determine whether the control voltage is within the specified range) and other circuitry such as a lock detect circuit. The control circuit is used to switch between the coarse loop and fine loop.

Operation of Automatic Coarse Tune PLL

In an embodiment, the center frequency of the VCO can vary due to the PVT variations by as large as +/−10%. So the control voltage of the VCO can vary by a large amount in order to compensate this variation in the center frequency and to achieve the desired frequency. This puts extra burden on the charge pump which has to operate with such a large range of control voltage and there can be a lot of variation in the gain of the VCO. This can be explained as below.

The C-V characteristics of the varactor used in this embodiment are as illustrated in the FIG. 6, where VCM is the common mode voltage of the tank set by the bias current and the size of the NMOS. If the process variation is such that control voltage (VCONT) sits at point A, the VCO gain will be maximum and if the process variation is such that VCONT sits at either B or C, the VCO gain will be minimum, i.e. 10% of the maximum gain.

In order to tune the center frequency, to avoid gain variation of the VCO and to lessen the burden on the charge pump we use external coarse tuning bits. Ideally speaking VCONT should sit at the common mode voltage of the tank across PVT in order to achieve the best performance in terms of reduced VCO gain variation. This can be done by the technique proposed in this document which avoids the manual tuning of the control bits and employs an automatic coarse tuning circuit to tune the center frequency of the VCO.

The low noise reference generator which generates the bias current for the VCO and the charge pump for the PLL is used to generate three fixed voltages 1.2 (constant reference voltage which is almost the mid-point of the analog supply) and 1.2+/−20% (i.e., 1.0 volt and 1.4 volt roughly) for a 2.5V supply.

The control voltage (VCONT) of the PLL is sensed continuously and if the control voltage is within the range of 1 to 1.4 volt there is no need for coarse tuning as the control voltage will be at most at an offset of +/−100 mv of the common mode voltage of the LC tank. This ensures that the VCO gain has not saturated.

When the control voltage (VCONT) is not within the range of 1 to 1.4 volt there is a need for coarse tuning in order to bring the control voltage near the common mode voltage of the cross coupled latch of the LC tank. When the control voltage is not within the range of 1 to 1.4 volt the fine loop is disabled and the coarse loop switches on. This is done automatically without any external control.

The control voltage (VCONT) is charged to 1.2 volt. The VCO gives an output frequency corresponding to this control voltage. The divided output of the VCO which goes into the PFD and the input reference frequency is fed as input to the frequency detector also.

The frequency detector 712 gives an UP signal if the divided VCO output frequency is greater than that of the input reference frequency. The frequency of the UP signal will be equal to the frequency difference between the divided VCO output frequency and the input reference frequency.

The frequency detector 712 gives a DOWN signal if the divided VCO output frequency is lesser than that of the input reference frequency. The frequency of the DOWN signal will be equal to the frequency difference between the divided VCO output frequency and the input reference frequency.

The UP signal is given to a 4 bit counter (UP counter 714) the DOWN signal is given to another 4 bit counter (DN counter 716). The UP counter 714 counts from 0000 to 1111 and the DOWN counter 716 counts from 1111 to 0000. The output of the UP counter 714 is given to the DOWN capacitor bank of the LC tank VCO and the output of the DOWN counter 716 is given to UP capacitor bank of the LC tank VCO.

The connection is made in such a way that if the divided VCO frequency is greater than the input reference frequency, the UP counter 714 starts counting and since the output of the UP counter 714 is fed to the DN capacitor bank the frequency difference starts reducing and for every rising edge of the UP pulse the frequency difference between the divided VCO frequency and the input reference frequency reduces by 20 Mhz/N (N is the loop division).

If the divided VCO frequency is less than the input reference frequency, the DN counter 716 starts counting and since the output of the DN counter is fed to the UP capacitor bank the frequency difference starts reducing and for every rising edge of the DN pulse the frequency difference between the divided VCO frequency and the input reference frequency reduces by 20 Mhz/N (N is the loop division).

When the frequency difference between the divided VCO frequency and the input reference frequency is less than 20 MHz/N a LOCK signal is set high which indicates that the coarse tune has been completed and then the coarse loop is switched off and the fine loop is switched on. The control voltage (VCONT) has to readjust itself by 20 MHz/KVCO in order to reach the exact frequency. The value by which control voltage (VCONT) changes will be much less than +/−100 mv, which ensures that the control does not oscillate between the coarse loop and the fine loop.

Since the control voltage (VCONT) is also being sensed along with the digital coarse tuning and the coarse loop can be switched on depending on the state of the control voltage (VCONT).

The technique for an automatic coarse tuning of a phase locked loop as described in embodiments of the present invention offers many advantages. The technique according to embodiments of the present invention is capable of monitoring the control voltage to switch on a coarse tune loop used to select the optimum tuning curve of the LC tank VCO, with both fine and coarse tune capability, so as to ensure that the control voltage is within a specified range and the VCO gain (KVCO) does not vary by not more than (+/−30%) and that the coarse tune bits are set automatically without any manual handling. Further, the technique can be generalized to have any arbitrarily small required gain variation by reducing the range of the voltages generated from the voltage reference and appropriately adjusting the capacitor bank for finer tuning.

Phase-locked loops according to embodiments of the present invention can be utilized in a variety of different types of electronic systems, such as communications systems.

From the foregoing it will be appreciated that, although specific embodiments of the invention have been described herein for purposes of illustration, various modifications may be made without deviating from the spirit and scope of the invention.

I claim:

1. A circuit for an automatic coarse tuning in a phase locked loop (PLL) by observing a variation in a control voltage to disable a fine loop and to enable a coarse loop as the control voltage departs from a specified range, said circuit comprising:

a bandgap module operatively coupled to said circuit for generating one or more signals;

a loop filter connected between the bandgap module and a first intermediate node for providing the control voltage;

a coarse loop module operatively coupled to the bandgap module and a second intermediate node for providing a coarse loop signal to said circuit for switching on a coarse loop tuning, said coarse loop module receiving the one or more signals from the bandgap module and receiving the control voltage from the first intermediate node;

a phase frequency detector connected to a first node and a second node for comparing phases of a first input signal and a second input signal, said phase frequency detector receiving said coarse loop signal;

a charge pump operatively coupled to the phase frequency detector for providing the control voltage at the first intermediate node, said charge pump receiving the coarse loop signal;

a frequency detector connected to the first node, a third node and a fourth node for generating one of an up signal and a down signal, said frequency detector receiving the coarse loop signal;

an up counter connected to the frequency detector for incrementing a count number, said up counter receiving the coarse loop signal;

a down counter connected to the frequency detector for decrementing a count number, said down counter receiving the coarse loop signal;

a voltage controlled oscillator (VCO) module operatively coupled to the up counter, the down counter, the charge pump, the loop filter, and said coarse loop module for generating an output signal at a third intermediate node for ensuring that variations in the output signal and a gain of said VCO being within said specified range; and a divider connected between the third node, the fourth node and the third intermediate node for dividing said output signal, said divider being coupled to the second node for providing the second input signal.

2. The circuit as claimed in claim 1, wherein said voltage controlled oscillator module comprises:

a first transistor connected between a first VCO node and a ground voltage;

a latch circuit operatively coupled between the first VCO node, a second VCO node and a third VCO node;

a first variable capacitor connected between the second VCO node and a fourth VCO node;

a first fixed capacitor connected between the second VCO node and the ground voltage;

a second variable capacitor connected between the third VCO node and the fourth VCO node;

a second fixed capacitor connected between the third VCO node and the ground voltage;

a first switched capacitance module connected between the second VCO node and a complementary ground voltage, said first switched capacitance module comprising at least four input terminals for receiving up binary bits;

a second switched capacitance module connected between the second VCO node and the complementary ground voltage, said second switched capacitance module comprising at least four input terminals for receiving down binary bits;

an inductor connected between the second VCO node and the third VCO node for providing a bias voltage through a center tap;

a third switched capacitance module connected between the third node and the complementary ground voltage, said third switched capacitance module comprising at least four output terminal for providing up binary bits; and a fourth switched capacitance module connected between the third node and the complementary ground voltage, said fourth switched capacitance module comprising at least four output terminals for providing down binary bits.

3. The circuit as claimed in claim 1, wherein said first input signal comprises an input reference frequency signal.

4. The circuit as claimed in claim 1, wherein said second input signal comprises a feedback reference frequency signal.

5. The circuit as claimed in claim 2, wherein the first switched capacitance module comprises a plurality of combination of a capacitor and a metal oxide semiconductor switch for turning on and off said metal oxide semiconductor periodically.

6. The circuit as claimed in claim 2, wherein the second switched capacitance module comprises a plurality of combination of a capacitor and a metal oxide semiconductor switch for turning on and off said metal oxide semiconductor periodically.

7. The circuit as claimed in claim 2, wherein the third switched capacitance module comprises a plurality of combination of a capacitor and a metal oxide semiconductor switch for turning on and off said metal oxide semiconductor periodically.

8. The circuit as claimed in claim 2, wherein the fourth switched capacitance module comprises a plurality of combination of a capacitor and a metal oxide semiconductor switch for turning on and off said metal oxide semiconductor periodically.

* * * * *